United States Patent
Sen et al.

(10) Patent No.: US 12,277,122 B1
(45) Date of Patent: Apr. 15, 2025

(54) SYSTEM AND METHOD FOR ACCELERATING QUERY EXECUTION

(71) Applicant: Microsoft Technology Licensing, LLC, Redmond, WA (US)

(72) Inventors: Rathijit Sen, Redmond, WA (US); Zezhou Huang, New York, NY (US); Matteo Interlandi, Torrance, CA (US); Marius Dumitru, Sammamish, WA (US); Carlo Aldo Curino, Woodinville, WA (US); Krystian Sakowski, Washington, DC (US); Hans C. Lehnert Merino, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/497,617

(22) Filed: Oct. 30, 2023

(51) Int. Cl.
   *G06F 16/2455* (2019.01)
   *G06F 16/22* (2019.01)
   *G06F 16/2453* (2019.01)

(52) U.S. Cl.
   CPC ...... *G06F 16/24553* (2019.01); *G06F 16/221* (2019.01); *G06F 16/24537* (2019.01); *G06F 16/24542* (2019.01)

(58) Field of Classification Search
   CPC ............ G06F 16/24553; G06F 16/221; G06F 16/24537; G06F 16/24542
   See application file for complete search history.

(56) References Cited

U.S. PATENT DOCUMENTS

| | | | |
|---|---|---|---|
| 9,430,524 B1* | 8/2016 | Narayanan | G06F 16/2456 |
| 10,146,837 B1 | 12/2018 | Narayanan | |
| 11,558,067 B2* | 1/2023 | Shi | H03M 7/46 |
| 2010/0030748 A1* | 2/2010 | Netz | G06F 16/24557 |
| | | | 707/769 |
| 2015/0347087 A1* | 12/2015 | Dickie | G06F 16/1744 |
| | | | 707/753 |

OTHER PUBLICATIONS

Abadi, et al., "Integrating compression and execution in column-oriented database systems", In Proceedings of ACM SIGMOD international conference on Management of data, Jun. 27, 2006, pp. 671-682.
International Search Report Received in PCT Application No. PCT/US2024/049696, mailed on Jan. 2, 2025, 14 pages.

* cited by examiner

*Primary Examiner* — Jared M Bibbee
(74) *Attorney, Agent, or Firm* — Brian J. Colandreo; Heath M. Sargeant; Holland & Knight LLP

(57) ABSTRACT

A method, computer program product, and computing system for optimizing query operations on run length encoding (RLE) data in a parallel processing computing system. Data is received in a plurality of columns of an input table of a parallel processing computing system for query execution; the system determines that at least a portion of the received data in a first number of columns is compressed according to run length encoding (RLE), thereby comprising RLE data columns including RLE data and that the received data in a second number of columns is not compressed according to run length encoding (RLE), thereby comprising non-RLE data columns including non-RLE data. A query operation is executed on the RLE data and the non-RLE data by prioritizing processing of the RLE data columns over processing of the non-RLE data columns.

20 Claims, 11 Drawing Sheets

Consider query:

SELECT B
WHERE A = 0 AND B = 0

1 billion rows in total
Col A has 100K runs
Col B is plain

For A, only 1 run selected
For B, ~half the data selected

Select both then AND

*maskA = eval(colA, "=0")*

*maskB = eval(colB, "=0")*

*mask = and(maskA, maskB)*

*finalB = apply_mask(colB, mask)*

*Takes 10.9 ms*

RLE first

*maskA = eval(colA, "=0")*

*selectB = apply_mask(colB, maskA)*
*maskB = eval(selectB, "=0")*

*fianlB = apply_mask(selectB, maskB)*

*Takes 2.12 ms*

SYSTEM AND METHOD FOR ACCELERATING QUERY EXECUTION

BACKGROUND

Graphics Processing Units (GPUs) are highly parallel processors designed to handle thousands of tasks simultaneously. This makes them particularly well-suited for tasks that can be parallelized, such as graphics rendering, scientific simulations, and certain types of machine learning computations. GPUs have become crucial in the field of deep learning and artificial intelligence (AI). Many deep learning frameworks leverage the parallel processing capabilities of GPUs to accelerate training of neural networks. GPUs are preferred over Central Processing Units (CPUs) in certain circumstances because of their parallel processing capabilities, in which complex tasks can be broken down into smaller, more manageable parts that can be processed concurrently, whereas CPUs have a more general-purpose architecture, making them versatile for a wide range of tasks but potentially less efficient for highly parallel computations.

A query optimizer is a fundamental component within a database management system designed to enhance the efficiency of query execution. When a user submits a query, typically in SQL or a similar query language, the optimizer takes on the responsibility of determining the most effective method for retrieving and processing the requested data. This involves a multi-step process starting with parsing the query, analyzing its structure, and rewriting it if needed to achieve optimal performance. The optimizer considers factors such as table access paths, join algorithms, filtering strategies, and parallelism to construct an execution plan that minimizes the overall cost, often measured in terms of time and resource utilization. The use of statistics, both about the data distribution and the database environment, is crucial in estimating costs accurately. The goal is to select the most efficient combination of operations to fulfill the query, taking advantage of available indexes, parallel processing capabilities, and other optimizations. In essence, the query optimizer plays a vital role in translating high-level queries into execution plans that ensure rapid and resource-effective data retrieval in database systems.

BRIEF DESCRIPTION OF THE DRAWINGS

Like reference symbols in the various drawings indicate like elements.

DETAILED DESCRIPTION

As will be discussed in greater detail below, implementations of the present disclosure are directed to accelerating query operations on compressed data in a GPU. However, it will be understood that implementations are also applicable for operation on compute backends that support massively parallel processing, e.g., GPUs, tensor processors, CPUs that have hundreds of cores or even many tens of cores, etc. Structured Query Language (SQL) is a domain-specific language used to manage and manipulate relational databases. SQL is widely used for interacting with relational databases, and its syntax is standardized, although specific database management systems (DBMS) might have variations. As will be discussed in greater detail below, implementations of the present disclosure are directed to accelerating processing of queries including data compressed according to run length encoding (RLE). RLE is a form of data compression where sequences of identical elements (runs) are replaced with the single element and either a count of how many times it is repeated or the start and end position in the run of the element. This technique is often used to reduce the size of data with repeated patterns and is particularly effective when there are long sequences of identical values. By using RLE to compress data, implementations of the disclosure are able to process larger data sets at a faster rate than would previously be able to be processed.

Figure 1:
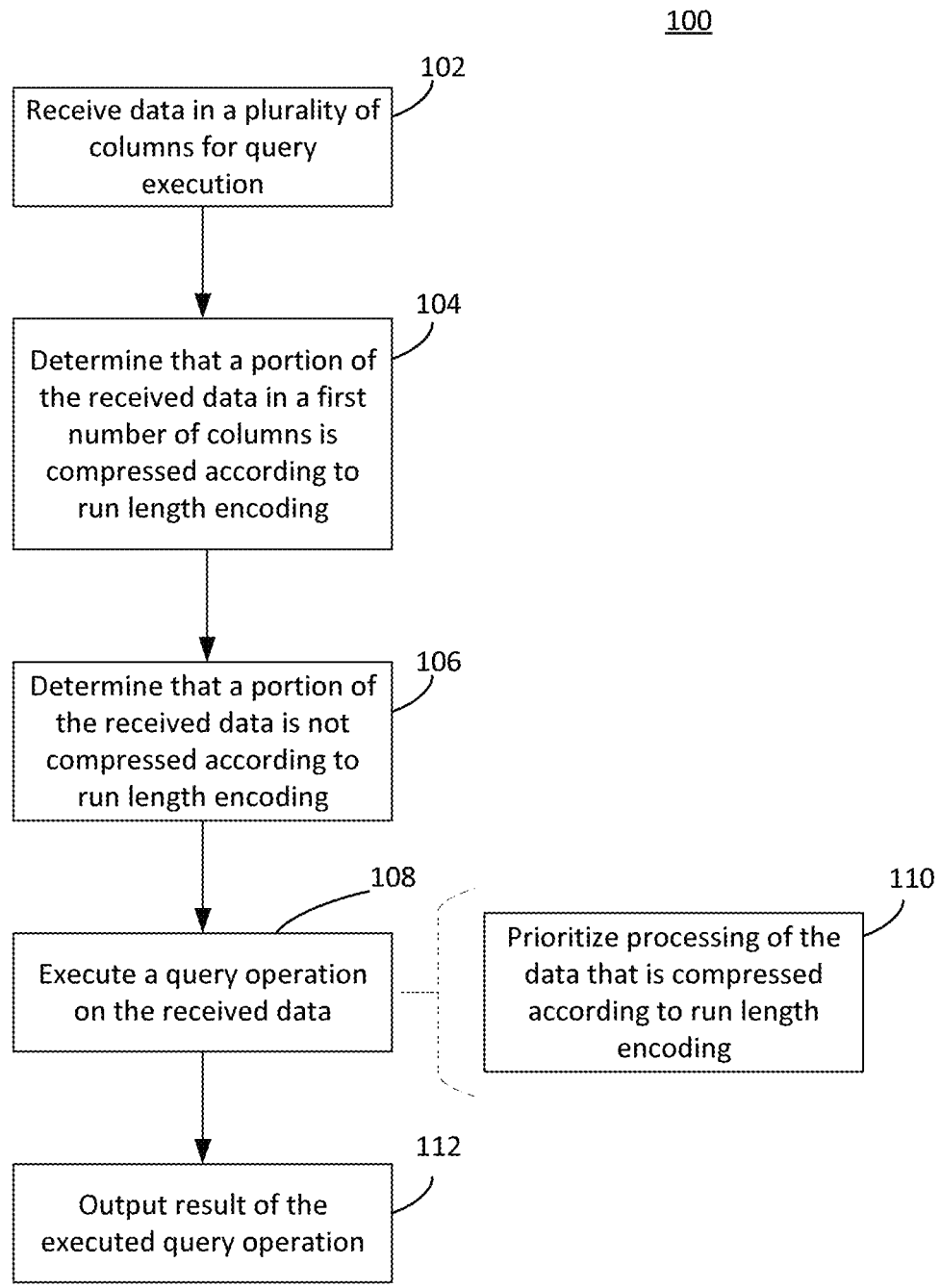
FIG. 1 is a flowchart depicting a query optimization process in accordance with implementations of the disclosure.

FIG. 1 is a flowchart showing a query optimization process 100. In an implementation, a parallel processing computing system, such as a graphics processing unit (GPU), receives data in a plurality of columns for query execution 102. A query optimizer portion of the parallel processing system analyzes the received data and determines that at least a portion of the received data in a first number of columns is compressed according to run length encoding (RLE), 104, thus being RLE data. The query optimizer determines that received data in a second number of columns is not compressed according to RLE, 106, thus being non-RLE data. The parallel processing system then executes a query operation on the received data, 108. In performing this execution of the query operation, the parallel processing system prioritizes processing of the RLE data, 110 by first executing the portion of the query operation in which at least one of the parameters of the query is RLE data. Once the query operations that include at least one RLE data parameters are executed, the system then executes query operations that do not include RLE data parameters. The result of the query operation is then output from the parallel processing system, 112.

Figure 2:
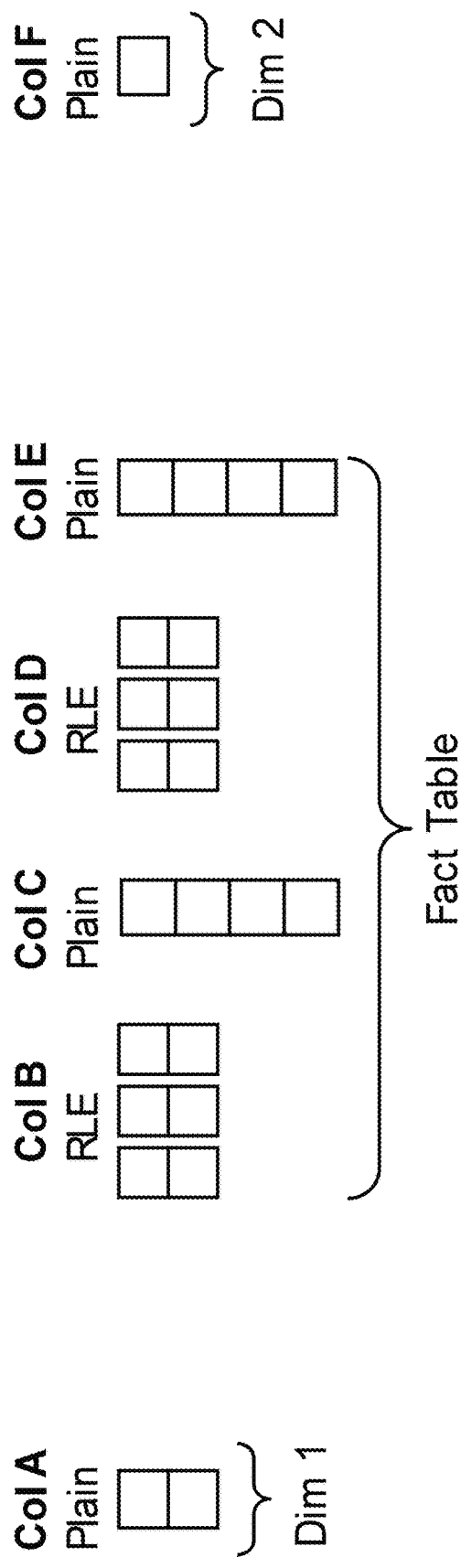
FIGS. 2-4 are diagrams depicting an example of optimizing a query operation.
Figure 4:
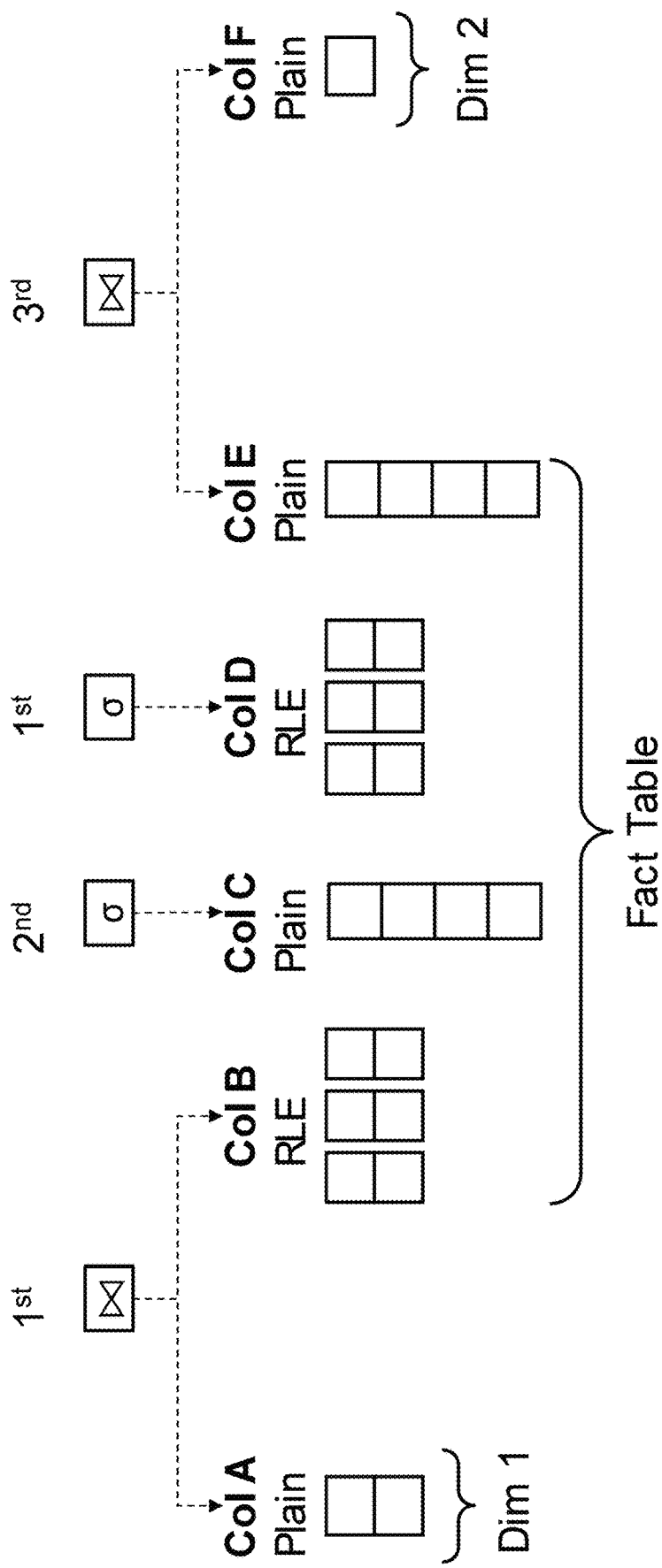

Referring to FIGS. 2 and 4, which graphically depict an example query operation, an implementation of the present disclosure will be discussed. In the example, the data set includes a fact table and 2 dimension tables Dim 1 and Dim 2. Dim 1 includes column A, which includes uncompressed or "plain" data and Dim 2 includes column F, which also includes uncompressed or "plain" data. The fact table includes column B, which includes RLE data, column C, which includes plain data, column D, which includes RLE data, and column E, which includes plain data. The query operation is a "select" operation in which data elements are selected according to the query A=B AND C=1 AND D=2 AND E=F.

Figure 3:
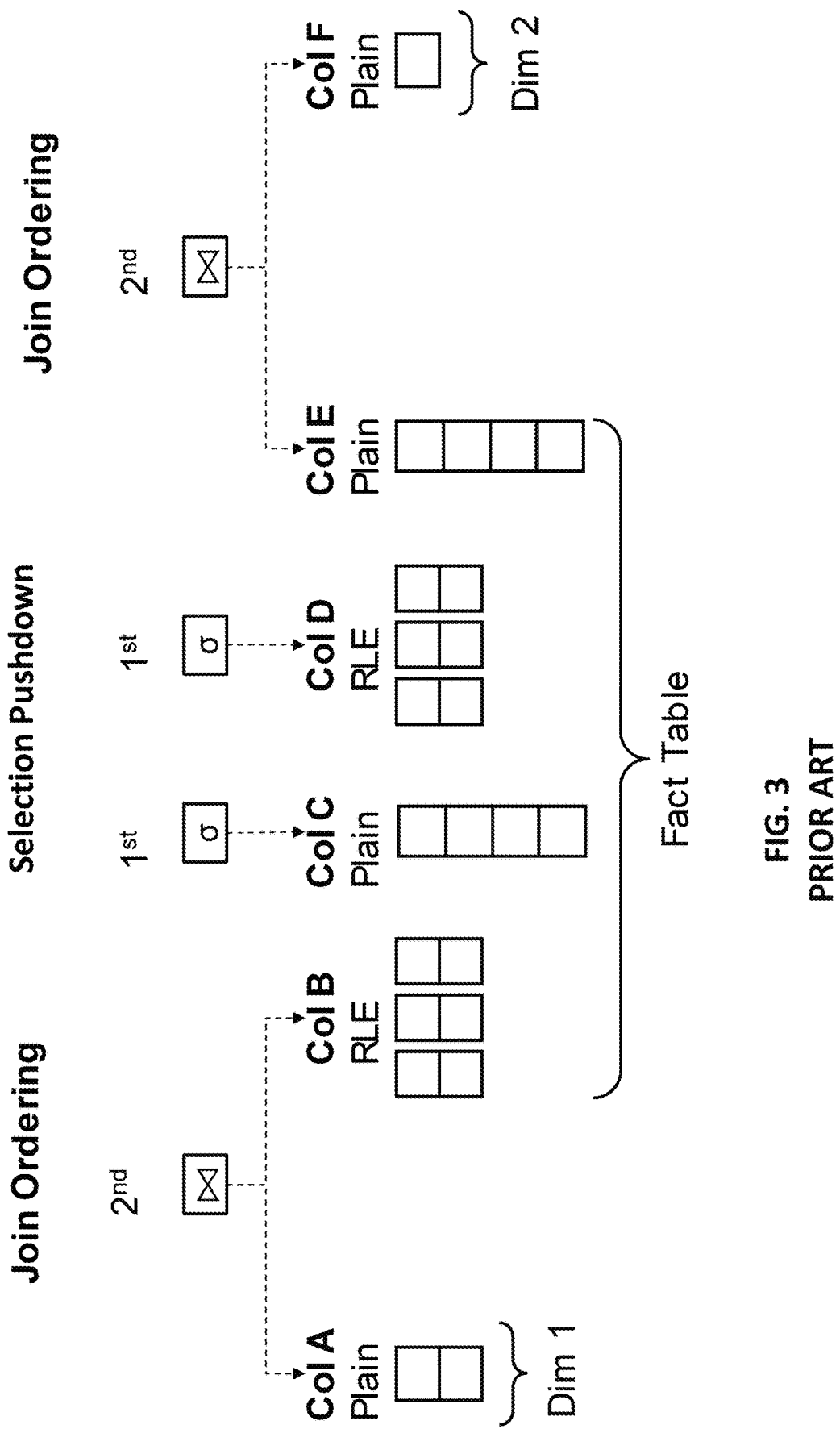

In a prior art system shown in FIG. 3, the selection operations (C=1, D=2) are performed first and then the join operations are performed. In this case, selection operations on column C and column D are executed first. As set forth in the query, data elements equal to 1 are selected in column C and data elements equal to 2 are selected in column D. This selection can reduce the data set by eliminating rows in which C is not equal to 1 and D is not equal to 2. However, because column C is in plain, uncompressed form, every data element in the column must be checked to determine if it is equal to 1. This example assumes that no indexes are present for the column. Since an uncompressed column could have hundreds of thousands of data elements, checking every element is relatively time-consuming.

Next, the join operations (A=B, E=F) are executed on the remaining rows in the data set. All data elements in column A that are the same as data elements in column B are identified and all data elements in column E that are the same as data elements in column F are identified. In this approach, the processing system is agnostic toward the form of the data in a column. Selections are performed first, regardless of whether the data is in a compressed form or not.

FIG. 4 illustrates the same operation when executed in accordance with an implementation of the present disclosure. As described above, a query optimizer will identify that column B and column D are compressed into RLE data. Therefore, when executing the operation, the system will prioritize execution of the portion of the query that includes the RLE data. In this example, the join operation between columns A and B and the selection operation on column C are performed first and the selection operation on column C and the join operation on columns E and F are performed last. Since the RLE data is in a compressed form, a reduced number of each value is included in the RLE data column. With RLE data, if one value in a run does not satisfy a condition, the entire run will not satisfy the condition since all values in the run are the same. This increases the chances that operations on the RLE data are highly selective, particularly cases where the compression ratio is high. This can greatly reduce the data set for the next operation, which reduces processing involved in executing the query, resulting in quicker execution times.

Figure 5:
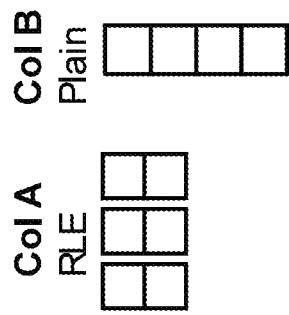
FIGS. 5-7 are diagrams depicting another example of optimizing a query operation.
Figure 6:
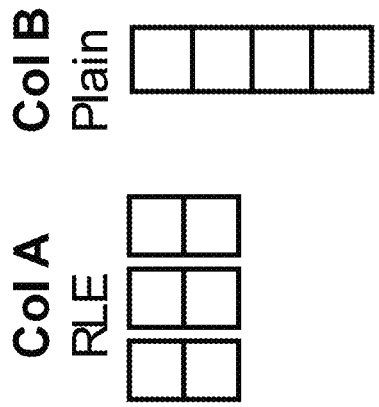
Figure 7:
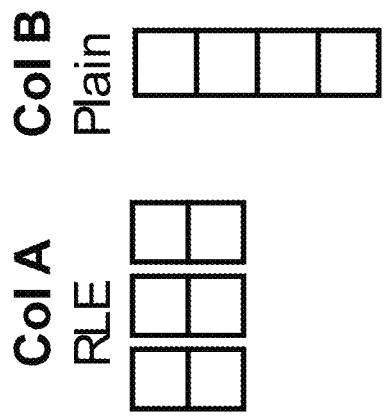

A further example of an implementation will now be discussed with reference to FIGS. 5-7. Shown in FIG. 5 are column A, consisting of RLE data and column B, which is plain, uncompressed data. The query is a selection operation of B, where A=0 and B=0. In this example, the data set included one billion rows in total, with column A having 100,000 runs. FIG. 6 illustrates a prior art manner of executing this selection. First, a MaskA is determined by identifying all data elements equal to 0 in column A. Then a MaskB is determined by identifying all data elements qual to 0 in column B. MaskA and MaskB are subjected to an AND operation to determine data elements that are common and equal to 0 in both columns and all resulting data elements in column B are selected. For this example, processing to obtain the result of the execution of the operation required 10.9 milliseconds. Again, since column A is compressed according to RLE, there are potentially much fewer data elements in column A, since only the base element for each consecutive run of values is included in the encoding. In the execution of the operation shown in FIG. 7, MaskA is created by identifying all base elements in column A that are equal to 0. That MaskA is then applied to column B to identify data elements in column B that are in the same row with data elements in column A that are equal to 0. Then, all data elements in column B remaining after the application of MaskA that are equal to 0 are identified and selected. This protocol for executing the selection operation required 2.12 ms, a significant reduction over the processing example described with reference to FIG. 6.

Figure 8:
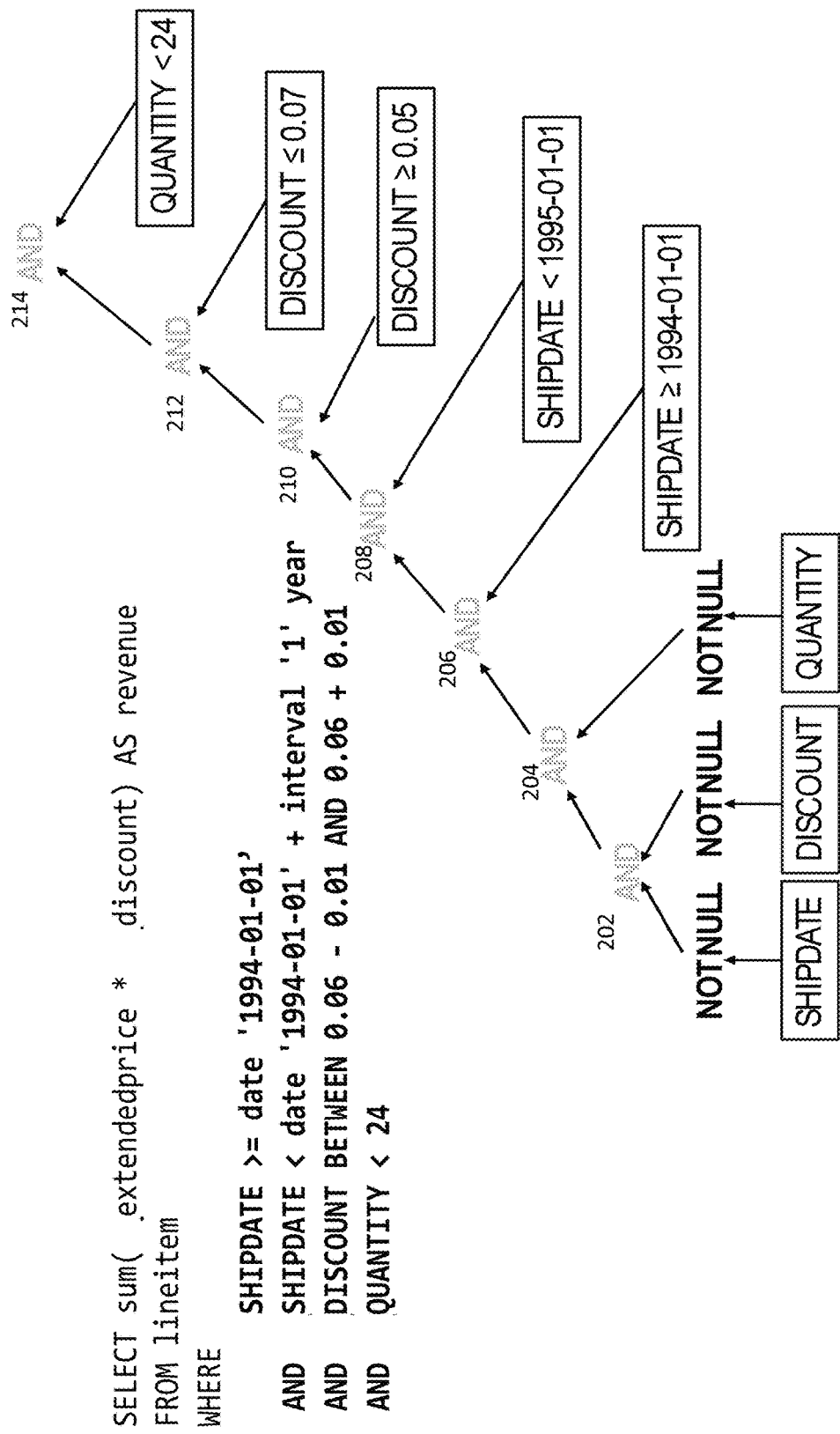
FIG. 8 is a diagram depicting a prior art process of executing predicates in a query operation.
Figure 9:
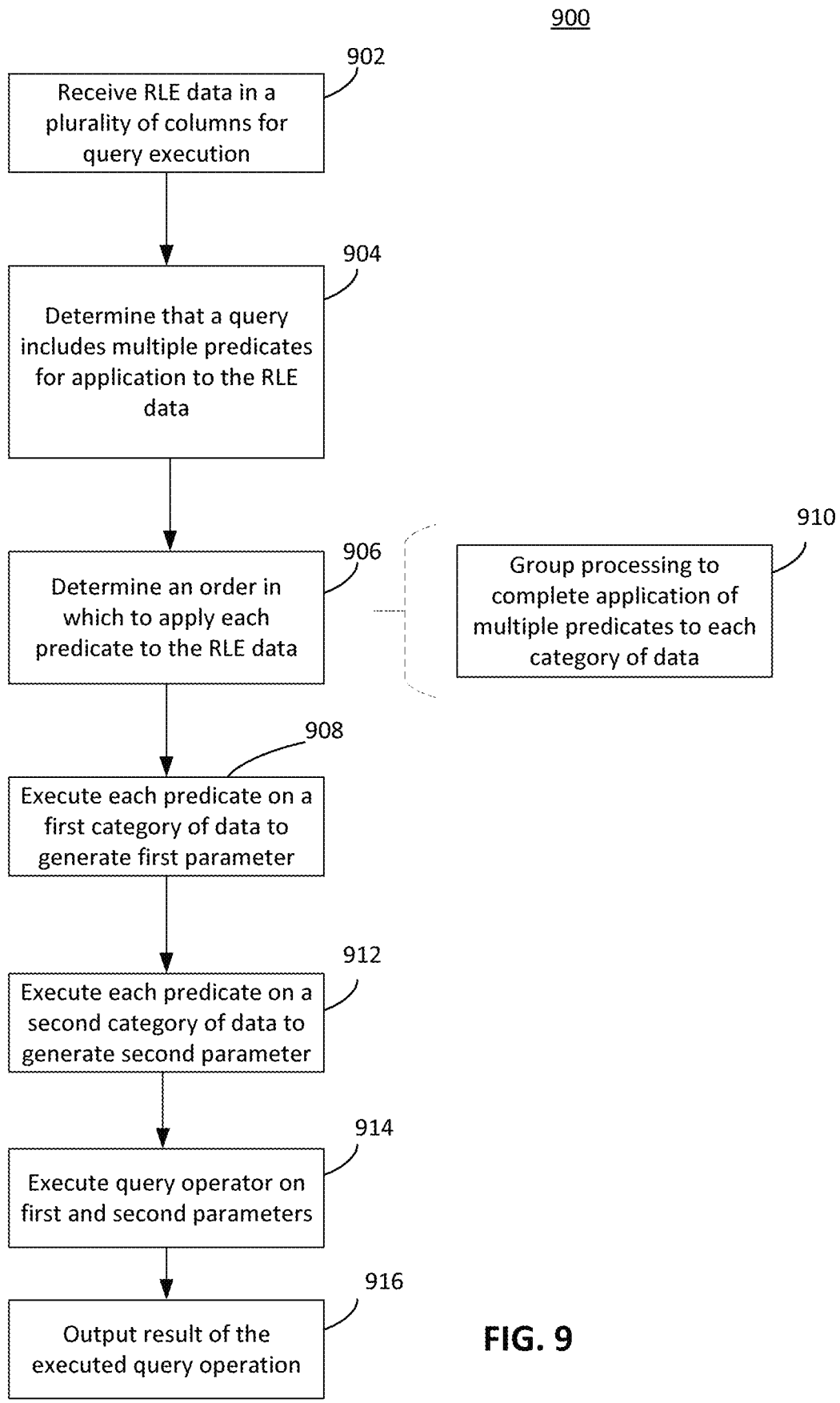
FIG. 9 is a flowchart depicting a query optimization process in accordance with implementations of the disclosure.
Figure 10:
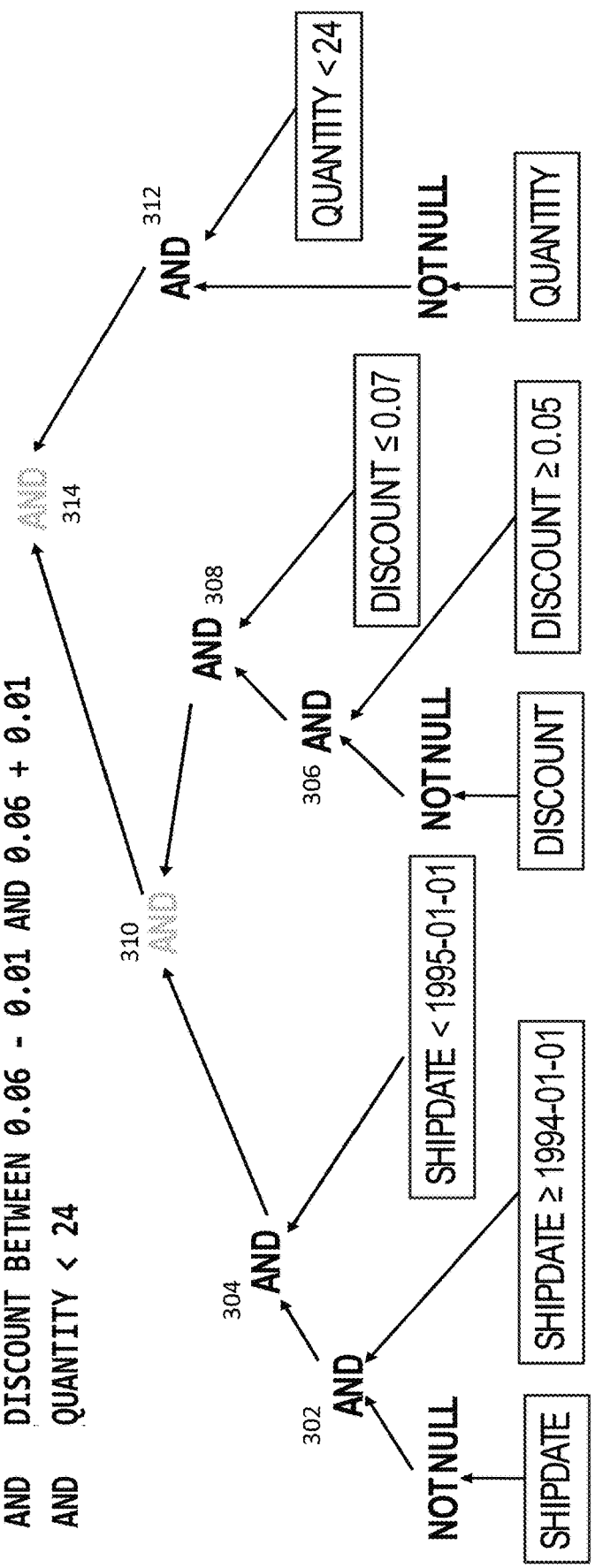
FIG. 10 is a diagram depicting a query optimization process in accordance with implementations of the disclosure.

Referring now to FIGS. 8-10, further examples of the operation of a query optimization process are shown. The operation to be executed in each example is the same, as shown in the FIGs. However, in the example shown in FIG. 8, the system processes the data without awareness of the type of encoding used for the various portions of the data. The operation executed in each of FIGS. 8-10 includes the application of predicates to RLE data. In the context of querying databases, a predicate is a critical element of a query that defines specific conditions or criteria for data retrieval. Predicates are primarily utilized within the SQL (Structured Query Language) framework, where they are typically included in the WHERE clause of a query statement. These conditions are used to filter and limit the results, ensuring that only relevant data meeting the specified criteria is returned. Predicates can encompass various components, including comparison operators, logical operators, in-between predicates, and pattern-matching operators.

In the example shown in FIG. 8, a selection operation is to be executed on data associated with sales information including SHIPDATE, DISCOUNT, and QUANTITY information. Since the system is not aware of any encoding of the information, it will process the elements of the operation in sequential order. Parameters of the operation include columns containing SHIPDATE information, DISCOUNT information, and QUANTITY information. After a NOT-NULL function is performed on each of the SHIPDATE, DISCOUNT, and QUANTITY columns, the SHIPDATE and DISCOUNT columns are subjected to an AND operation 202. The result of AND operation 202 is then subjected to an AND operation 204 with the QUANTITY column. The result of AND 204 is subjected to an AND operation 206 with a first range of SHIPDATE information, the result of which being subjected to an AND operation 208 with a second range of SHIPDATE information. The result of AND operation 208 is then subjected to an AND operation 210 with a first range of the DISCOUNT information. The result of AND 210 is subjected to an AND operation 212 with a second range of DISCOUNT information, the result of which being subjected to an AND operation 214 with a range of QUANTITY information.

Each of these AND operations 202 through 214 are computationally expensive because of the disparity of information that is contained in each of the SHIPDATE, DISCOUNT, and QUANTITY columns. For example, intersections of ranges need to be calculated since the type of information in each column is different from the information with which the AND operation is being applied.

In contrast, in the example shown in FIG. 10, the same selection operation is executed, but with the query optimizer being aware of the type of encoding applied to the data columns and also aware of the cost of the execution of each AND operation. Generally, in this implementation of the disclosure, in which multiple predicates are applied to RLE data, the system optimizes the query operations by ordering the sequence of the application of the predicates to reduce the computational cost of the operations. As such, the system will perform the application of the predicates in an order that groups the application of each predicate on common RLE data categories so that the outcome of the application of the predicate for each category is determined before predicates that are applied to disparate RLE data categories. While the example described here shows an AND operation, it will be understood that other logical operations, such as OR, can also be executed.

A process of predicate ordering optimization 900 in accordance with implementations of the disclosure is shown in FIG. 9. RLE data is received at a parallel processing computing system in a plurality of columns for query execution 902. Each column represents data associated with a particular category. Once the parallel processing computing system determines that the data is encoded as RLE data, based on a query that includes multiple predicates for application to the RLE data, 904, an order in which to apply each predicate to the RLE data is determined, 906. The order is determined by grouping the processing of each predicate to a data column including a category of data before applying the predicates to a next data column including a disparate category of data, 910. Once the ordering or grouping is determined, each predicate is executed on a first category of data 908 to generate a first parameter and then each predicate is executed on a second (and subsequent, if present) category of data, 912 to generate a second (and subsequent, if present) parameter. This process is carried out for each category of data in the query operation. Once the predicates have been applied and the parameters generated, query operators are executed on the first and second (and subsequent, if present) parameters, 914 and the result is output from the system 916. Since each predicate is executed on the same data category column before moving to the next data category column, and the resulting parameters are then subjected to operational queries, the computational cost of the query processing is reduced. Note that only predicate orders that result in a functionally correct query execution are considered. Accordingly, the ordering/grouping is done only if/as far as possible so that executing the resulting plan will still give correct results. The described predicate ordering can be done within a query optimizer function on the parallel processing system prior to the execution of a query. Alternatively, predicate ordering can be performed dynamically within a query execution engine of the parallel processing system.

In FIG. 10, after a NOTNULL function is performed on each of the SHIPDATE, DISCOUNT, and QUANTITY columns, an AND operation 302 is performed between the SHIPDATE column and a first date range of the SHIPDATE column. The result of AND 302 is subjected to an AND operation 304 with a second date range of the SHIPDATE column. Since these two AND operations 302, 304 are executed on data from the same data column with data that has been encoded in the same manner, these AND operations are computationally "inexpensive," requiring less overhead than an AND operation between different data columns.

After the NOTNULL function on the DISCOUNT column, an AND operation 306 is performed on the DISCOUNT column and a first range of the DISCOUNT column. The result of AND operation 306 is subjected to an AND operation 308 with a second range of data in the DISCOUNT column. After the NOTNULL function on the QUANTITY column, an AND operation 312 is performed on the QUANTITY column and a first range of the QUANTITY column. The result of AND operations 304 and 308 are subjected to AND operation 310 and the result of AND operations 310 and 312 are subjected to AND operation 314 to obtain the desired selected data.

Since AND operations 310 and 314 include data from different columns (SHIPDATE and DISCOUNT in AND operation 310 and DISCOUNT and QUANTITY in AND operation 314), those AND operations have a higher cost overhead. However, as mentioned, since each of the AND operations 302, 304, 306, 308, and 312 are operating on data from the same columns, the computational cost of the operations is reduced compared to the process shown in FIG. 8, in which many of the AND operations were performed on data from different columns with possibly different encoding. As shown, both operations in FIGS. 8 and 9 include the same number of AND operations, however, in the example of FIG. 9, since the query optimizer is aware of the encoding scheme for the data, it is able to perform the AND operations in an order that reduces the computational cost of the operation.

Accordingly, by utilizing a query optimizer that is aware of encoding schemes of the data on which it is operating, the order of performing query operations on particular sets of data can be manipulated to reduce the computational cost of the query processing. For example, prioritizing the processing of RLE data over non-RLE data results in reduced computational cost of the query operations. Further, when multiple predicates are applied to RLE data, the operation of the predicates can be ordered to optimize the processing to reduce the computational cost of the query operations.

Figure 11:
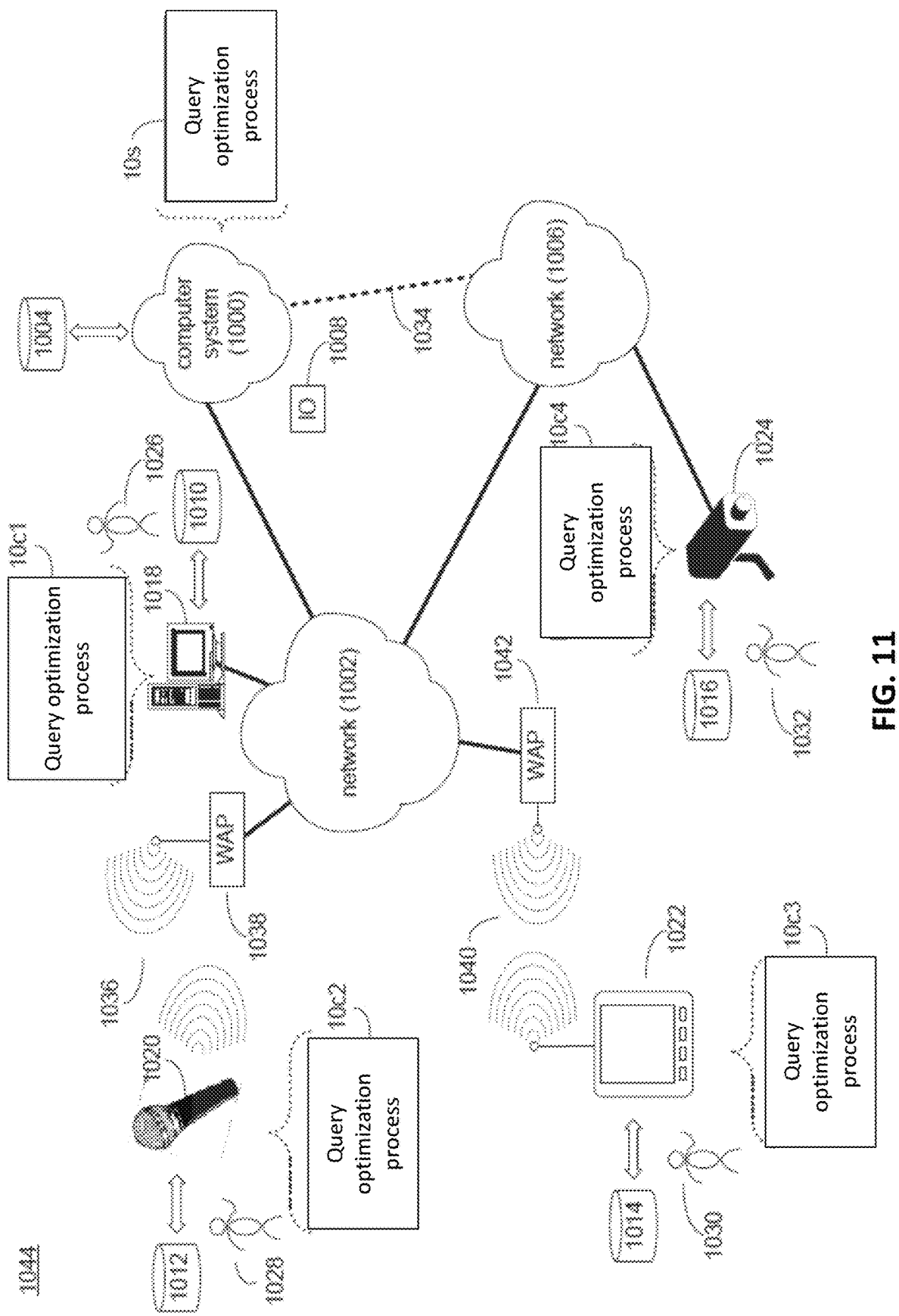
FIG. 11 is a diagrammatic view of a computer system and the audio signal disentanglement process coupled to a distributed computing network.

System Overview:

Referring to FIG. 11, there is shown an query optimization process 10. Query optimization process 10 may be implemented as a server-side process, a client-side process, or a hybrid server-side/client-side process. For example, query optimization process 10 may be implemented as a purely server-side process via computational cost reduction process 10s. Alternatively, query optimization process 10 may be implemented as a purely client-side process via one or more of query optimization process 10c1, query optimization process 10c2, query optimization process 10c3, and query optimization process 10c4. Alternatively still, query optimization process 10 may be implemented as a hybrid server-side/client-side process via query optimization process 10s in combination with one or more of query optimization process 10c1, query optimization process 10c2, query optimization process 10c3, and query optimization process 10c4.

Accordingly, query optimization process 10 as used in this disclosure may include any combination of query optimization process 10s, query optimization process 10c1, query optimization process 10c2, query optimization process 10c3, and query optimization process 10c4.

Query optimization process 10s may be a server application and may reside on and may be executed by a computer system 1000, which may be connected to network 1002 (e.g., the Internet or a local area network). Computer system 1000 may include various components, examples of which may include but are not limited to: a personal computer, a server computer, a series of server computers, a mini computer, a mainframe computer, one or more Network Attached Storage (NAS) systems, one or more Storage Area Network (SAN) systems, one or more Platform as a Service (PaaS) systems, one or more Infrastructure as a Service (IaaS) systems, one or more Software as a Service (SaaS) systems, a cloud-based computational system, and a cloud-based storage platform.

A SAN includes one or more of a personal computer, a server computer, a series of server computers, a minicomputer, a mainframe computer, a RAID device and a NAS system. The various components of computer system 1000 may execute one or more operating systems.

The instruction sets and subroutines of computational cost reduction process 10s, which may be stored on storage device 1004 coupled to computer system 1000, may be executed by one or more processors (not shown) and one or more memory architectures (not shown) included within computer system 1000. Examples of storage device 1004 may include but are not limited to: a hard disk drive; a RAID device; a random-access memory (RAM); a read-only memory (ROM); and all forms of flash memory storage devices.

Network 1002 may be connected to one or more secondary networks (e.g., network 1004), examples of which may include but are not limited to: a local area network; a wide area network; or an intranet, for example.

Various IO requests (e.g., IO request 1008) may be sent from query optimization process 10s, query optimization process 10c1, query optimization process 10c2, Query optimization process 10c3 and/or query optimization process 10c4 to computer system 1000. Examples of IO request 1008 may include but are not limited to data write requests (i.e., a request that content be written to computer system 1000) and data read requests (i.e., a request that content be read from computer system 1000).

The instruction sets and subroutines of query optimization process 10c1, query optimization process 10c2, query optimization process 10c3 and/or computational cost reduction process 10c4, which may be stored on storage devices 1010, 1012, 1014, 1016 (respectively) coupled to client electronic devices 1018, 1020, 1022, 1024 (respectively), may be executed by one or more processors (not shown) and one or more memory architectures (not shown) incorporated into client electronic devices 1018, 1020, 1022, 1024 (respectively). Storage devices 1010, 1012, 1014, 1016 may include but are not limited to: hard disk drives; optical drives; RAID devices; random access memories (RAM); read-only memories (ROM), and all forms of flash memory storage devices. Examples of client electronic devices 1018, 1020, 1022, 1024 may include, but are not limited to, personal computing device 1018 (e.g., a smart phone, a personal digital assistant, a laptop computer, a notebook computer, and a desktop computer), audio input device 1020 (e.g., a handheld microphone, a lapel microphone, an embedded microphone (such as those embedded within eyeglasses, smart phones, tablet computers and/or watches) and an audio recording device), display device 1022 (e.g., a tablet computer, a computer monitor, and a smart television), a hybrid device (e.g., a single device that includes the functionality of one or more of the above-references devices; not shown), an audio rendering device (e.g., a speaker system, a headphone system, or an earbud system; not shown), and a dedicated network device (not shown).

Users 1026, 1028, 1030, 1032 may access computer system 1000 directly through network 1002 or through secondary network 1006. Further, computer system 1000 may be connected to network 1002 through secondary network 1006, as illustrated with link line 1034.

The various client electronic devices (e.g., client electronic devices 1018, 1020, 1022, 1024) may be directly or indirectly coupled to network 1002 (or network 1006). For example, personal computing device 1018 is shown directly coupled to network 1002 via a hardwired network connection. Further, machine vision input device 1024 is shown directly coupled to network 1006 via a hardwired network connection. Audio input device 1022 is shown wirelessly coupled to network 1002 via wireless communication channel 1036 established between audio input device 1020 and wireless access point (i.e., WAP) 1038, which is shown directly coupled to network 1002. WAP 1038 may be, for example, an IEEE 802.11a, 802.11b, 802.11g, 802.11n, Wi-Fi, and/or any device that is capable of establishing wireless communication channel 1036 between audio input device 1020 and WAP 1038. Display device 1022 is shown wirelessly coupled to network 1002 via wireless communication channel 1040 established between display device 1022 and WAP 1042, which is shown directly coupled to network 1002.

The various client electronic devices (e.g., client electronic devices 1018, 1020, 1022, 1024) may each execute an operating system, wherein the combination of the various client electronic devices (e.g., client electronic devices 1018, 1020, 1022, 1024) and computer system 1000 may form modular system 1044.

General:

As will be appreciated by one skilled in the art, the present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be used. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object-oriented programming language. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet.

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general-purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, not at all, or in any combination with any other flowcharts depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising." when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A computer-implemented method, executed on a computing device, comprising:
    receiving data in a plurality of columns of an input table of a parallel processing computing system for query execution;
    determining that at least a portion of the received data in a first number of columns is compressed according to run length encoding (RLE), thereby comprising RLE data columns including RLE data;
    determining that the received data in a second number of columns is not compressed according to run length encoding (RLE), thereby comprising non-RLE data columns including non-RLE data;
    executing a query operation on the RLE data and the non-RLE data by prioritizing processing of the RLE data columns over processing of the non-RLE data columns.

2. The computer-implemented method of claim 1, wherein the plurality of columns includes at least one column in a fact table and at least one column in a dimension table.

3. The computer-implemented method of claim 1, wherein the non-RLE data is non-encoded data.

4. The computer-implemented method of claim 1, wherein the parallel processing computing system comprises a graphics processing unit.

5. The computer-implemented method of claim 1, wherein prioritizing processing of the RLE data columns includes determining a reduced-cost order of executing query operations.

6. The computer-implemented method of claim 1, wherein prioritizing processing of the RLE data columns comprises first executing the query operation on all RLE data columns and then executing the query operation on all non-RLE data columns.

7. The computer-implemented method of claim 1, wherein the query operation comprises a plurality of query functions.

8. The computer-implemented method of claim 7, wherein prioritizing processing of the RLE data columns comprises first executing the query operation on all RLE data columns without consideration of the types of query functions to be performed.

9. A computing system comprising:
a memory; and
a processor to:
- receive data in a plurality of columns of an input table of a parallel processing computing system for query execution;
- determine that at least a portion of the received data in a first number of columns is encoded, thereby comprising encoded data columns including encoded data;
- determine that the received data in a second number of columns is not encoded, thereby comprising non-encoded data columns including non-encoded data;
- execute a query operation on the encoded data and the non-encoded data by prioritizing processing of the encoded data columns over processing of the non-encoded data columns.

10. The computing system of claim 9, wherein the encoded data is encoded according to run length encoding.

11. The computing system of claim 9, wherein the plurality of columns includes at least one column in a fact table and at least one column in a dimension table.

12. The computing system of claim 9, wherein the parallel processing computing system comprises a graphics processing unit.

13. The computing system of claim 9, wherein prioritizing processing of the encoded data columns includes determining a reduced-cost order of executing query operations.

14. The computing system of claim 9, wherein prioritizing processing of the encoded data columns comprises first executing the query operation on all encoded data columns and then executing the query operation on all non-encoded data columns.

15. The computing system of claim 9, wherein the query operation comprises a plurality of query functions.

16. The computer-implemented method of claim 15, wherein prioritizing processing of the RLE data columns comprises executing the query operation on all RLE data columns without consideration of the types of query functions to be performed.

17. A computer-implemented method, executed on a computing device, comprising:
- receiving data in a plurality of columns of an input table of a parallel processing computing system for query operation execution;
- determining that the received data in a plurality of columns is compressed according to run length encoding (RLE), thereby comprising RLE data columns including RLE data, wherein the RLE data in each column represents a disparate data category;
- determining that a query to be performed on the RLE data columns of RLE data includes a plurality of predicates to be applied on each of the plurality of RLE data columns;
  - executing each of the plurality of predicates on a first RLE data column to generate a first parameter;
  - executing each of the plurality of predicates on a second RLE data column to generate a second parameter; and
  - executing a query operator on the first and second parameters to generate an output of the query operation.

18. The computer-implemented method of claim 17, further comprising determining an order of execution of the predicates on the RLE data columns prior to executing the plurality of predicates.

19. The computer-implemented method of claim 18, wherein determining an order of execution of the predicates on the RLE data columns includes grouping processing of the plurality of predicates to complete application of the plurality of predicates to each data category represented in each RLE data column.

20. The computer-implemented method of claim 19, wherein the order of execution of the predicates on the RLE data columns is determined to minimize a computational cost of the query operation execution.

* * * * *